(12) United States Patent
Fukuda et al.

(10) Patent No.: US 10,340,115 B2
(45) Date of Patent: *Jul. 2, 2019

(54) CHARGED PARTICLE BEAM APPARATUS

(71) Applicant: Hitachi High-Technologies Corporation, Minato-ku, Tokyo (JP)

(72) Inventors: Muneyuki Fukuda, Tokyo (JP); Yoshinori Momonoi, Tokyo (JP); Akihiro Miura, Tokyo (JP); Fumihiro Sasajima, Tokyo (JP); Hiroaki Mito, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/869,460

(22) Filed: Jan. 12, 2018

(65) Prior Publication Data
US 2018/0138010 A1 May 17, 2018

Related U.S. Application Data

(63) Continuation of application No. 15/292,832, filed on Oct. 13, 2016, now Pat. No. 9,892,887.

(30) Foreign Application Priority Data

Oct. 15, 2015 (JP) .................. 2015-203339

(51) Int. Cl.
*H01J 37/21* (2006.01)
*H01J 37/22* (2006.01)
*H01J 37/28* (2006.01)

(52) U.S. Cl.
CPC ............. *H01J 37/22* (2013.01); *H01J 37/21* (2013.01); *H01J 37/28* (2013.01);
(Continued)

(58) Field of Classification Search
CPC ....... H01J 37/22; H01J 37/28; H01J 2237/024
(Continued)

(56) References Cited

U.S. PATENT DOCUMENTS

| 6,114,681 A | 9/2000 | Komatsu |
| 8,294,118 B2 | 10/2012 | Kono et al. |
| 9,892,887 B2 * | 2/2018 | Fukuda .................. H01J 37/22 |

FOREIGN PATENT DOCUMENTS

| JP | 10-333020 A | 12/1998 |
| JP | 2009-176542 A | 8/2009 |

(Continued)

*Primary Examiner* — Nicole M Ippolito
*Assistant Examiner* — Hanway Chang
(74) *Attorney, Agent, or Firm* — Crowell & Moring LLP

(57) ABSTRACT

A charged particle beam device is provided that performs proper beam adjustment while suppressing a decrease in MAM time, with a simple configuration without adding a lens, a sensor, or the like. The charged particle beam device includes: an optical element which adjusts a charged particle beam emitted from a charged particle source; an adjustment element which adjusts an incidence condition of the charged particle beam with respect to the optical element; and a control device which controls the adjustment element, wherein the control device determines a difference between a first feature amount indicating a state of the optical element based on the condition setting of the optical element, and a second feature amount indicating a state where the optical element reaches based on the condition setting and executes adjustment by the adjustment element when the difference is greater than or equal to a predetermined value.

11 Claims, 10 Drawing Sheets

(52) U.S. Cl.
 CPC ... *H01J 2237/024* (2013.01); *H01J 2237/216* (2013.01); *H01J 2237/2817* (2013.01)

(58) Field of Classification Search
 USPC .............................. 250/492.1, 492.2, 492.3
 See application file for complete search history.

(56) References Cited

FOREIGN PATENT DOCUMENTS

| | | | |
|---|---|---|---|
| JP | 2010-182424 | A | 8/2010 |
| JP | 2014-135227 | A | 7/2014 |

\* cited by examiner

[Fig. 1]
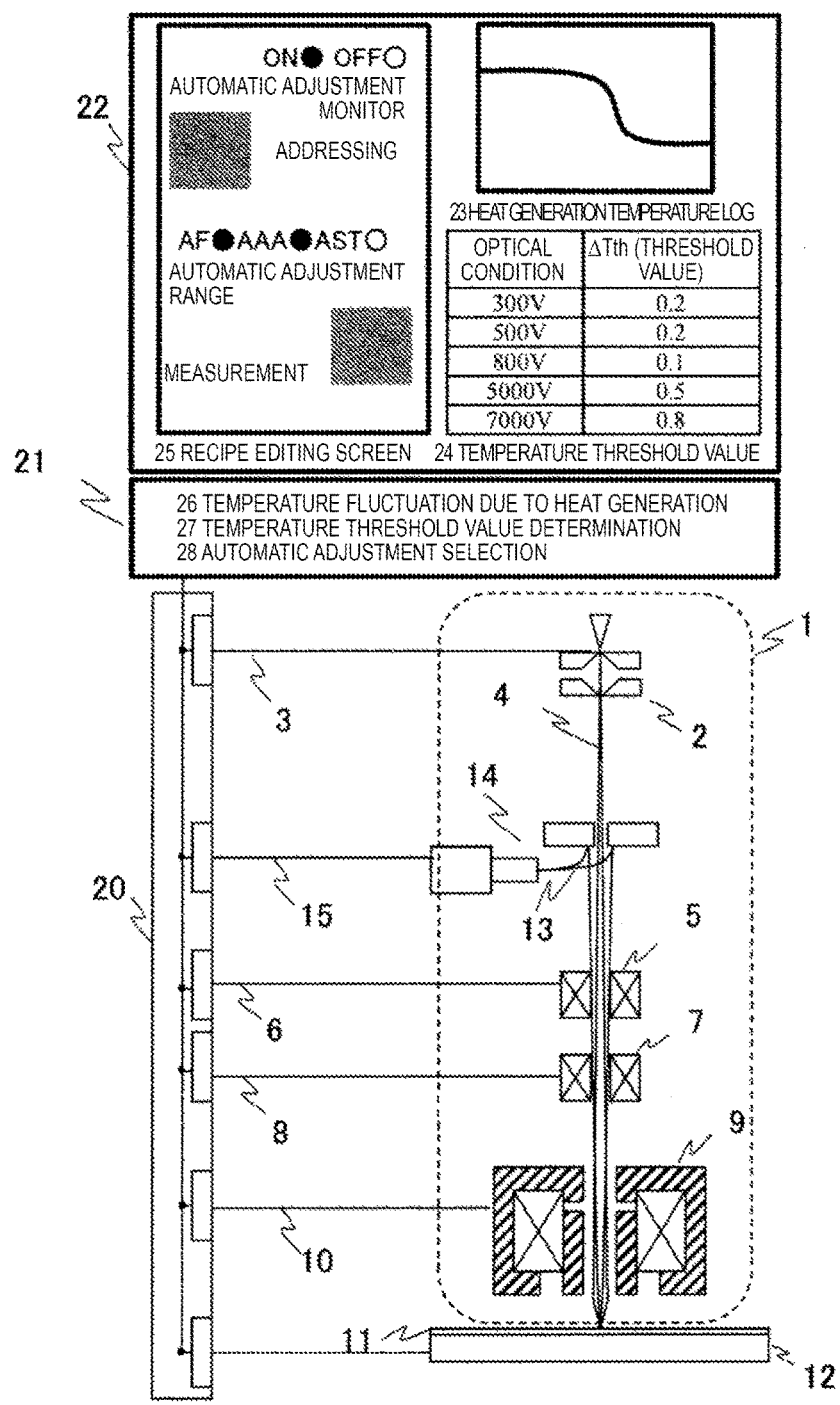

[Fig. 2]
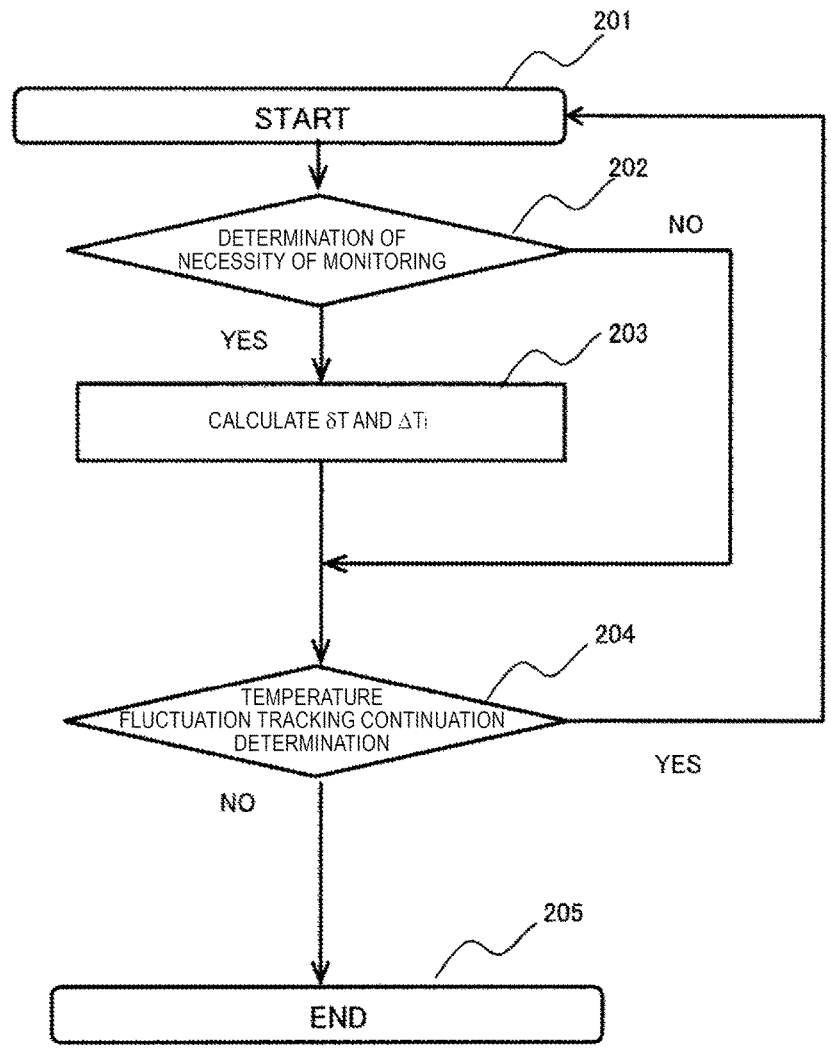

[Fig. 3]
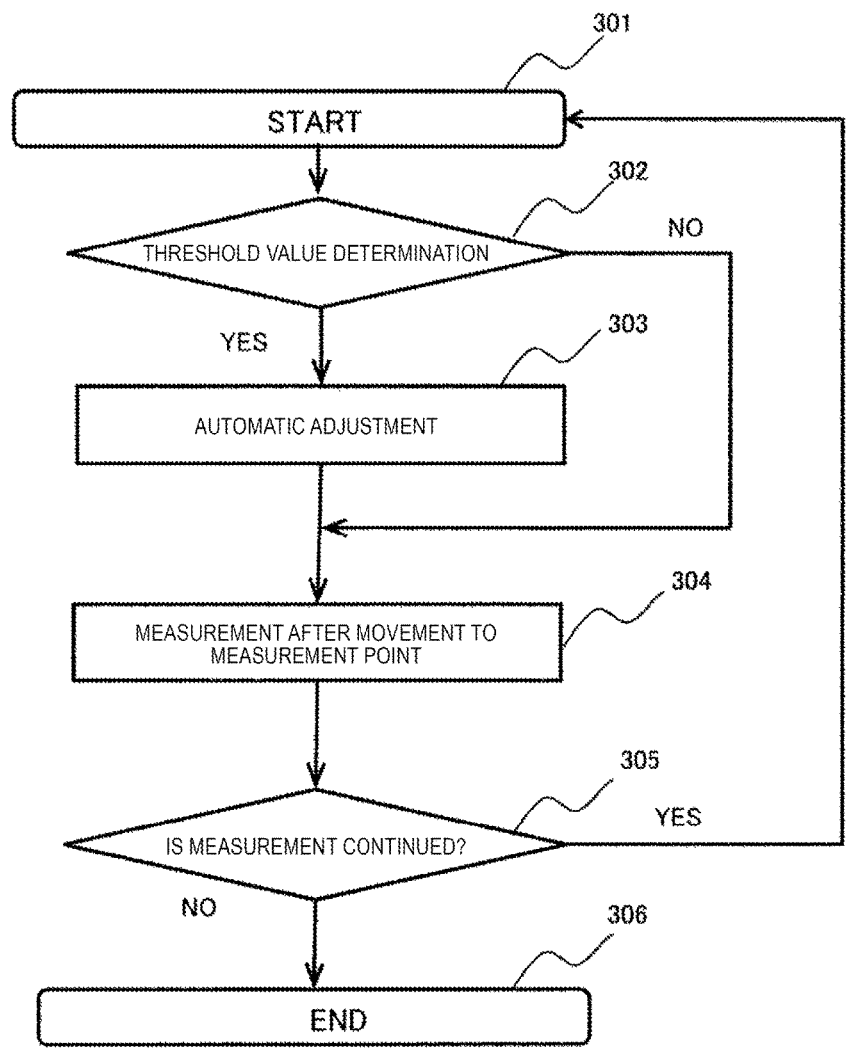

[Fig. 4]

| ACCELERATION (V) | CURRENT (pA) | DEPTH OF FOCUS | THRESHOLD VALUE |
|---|---|---|---|
| 300 | 3 | 100 | 0.2 |
| 500 | 5 | 200 | 0.2 |
| 800 | 8 | 300 | 0.1 |
| 1000 | 50 | 500 | 0.5 |
| 1600 | 70 | 1000 | 0.3 |
| 3000 | 80 | 2000 | 0.7 |
| 5000 | 1000 | 3000 | 0.8 |

[Fig. 5A]
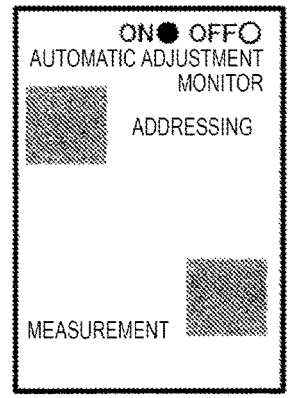
[Fig. 5B]
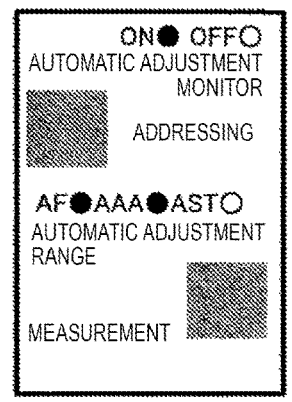
[Fig. 5C]
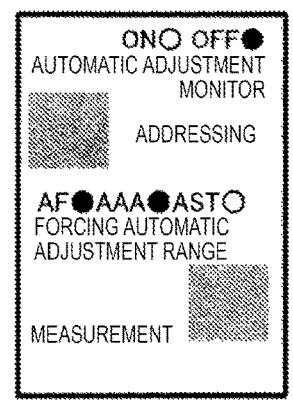

[Fig. 5D]
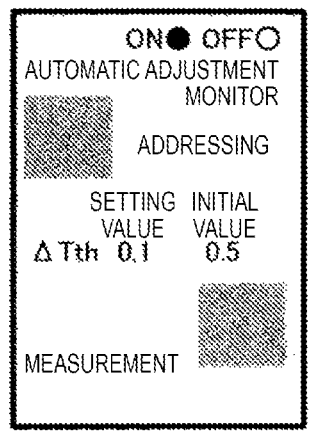
[Fig. 5E]
| PRE-ACCELERATION (V) | CURRENT (pA) | DEPTH OF FOCUS | THRESHOLD VALUE |
|---|---|---|---|
| 300 | 3 | 100 | 0.2 |
| 500 | 5 | 200 | 0.2 |
| 800 | 8 | 300 | 0.2 |
| 1000 | 50 | 500 | 0.2 |
| 1600 | 70 | 1000 | 0.1 |
| 3000 | 80 | 2000 | 0.1 |
| 5000 | 1000 | 3000 | 0.1 |

[Fig. 7]
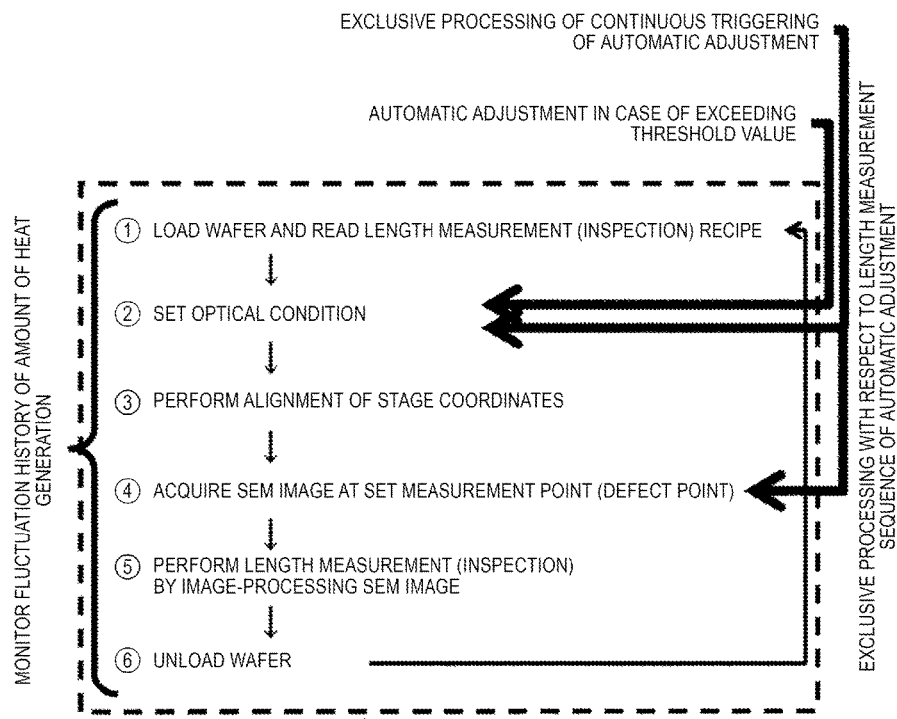

[Fig. 8]
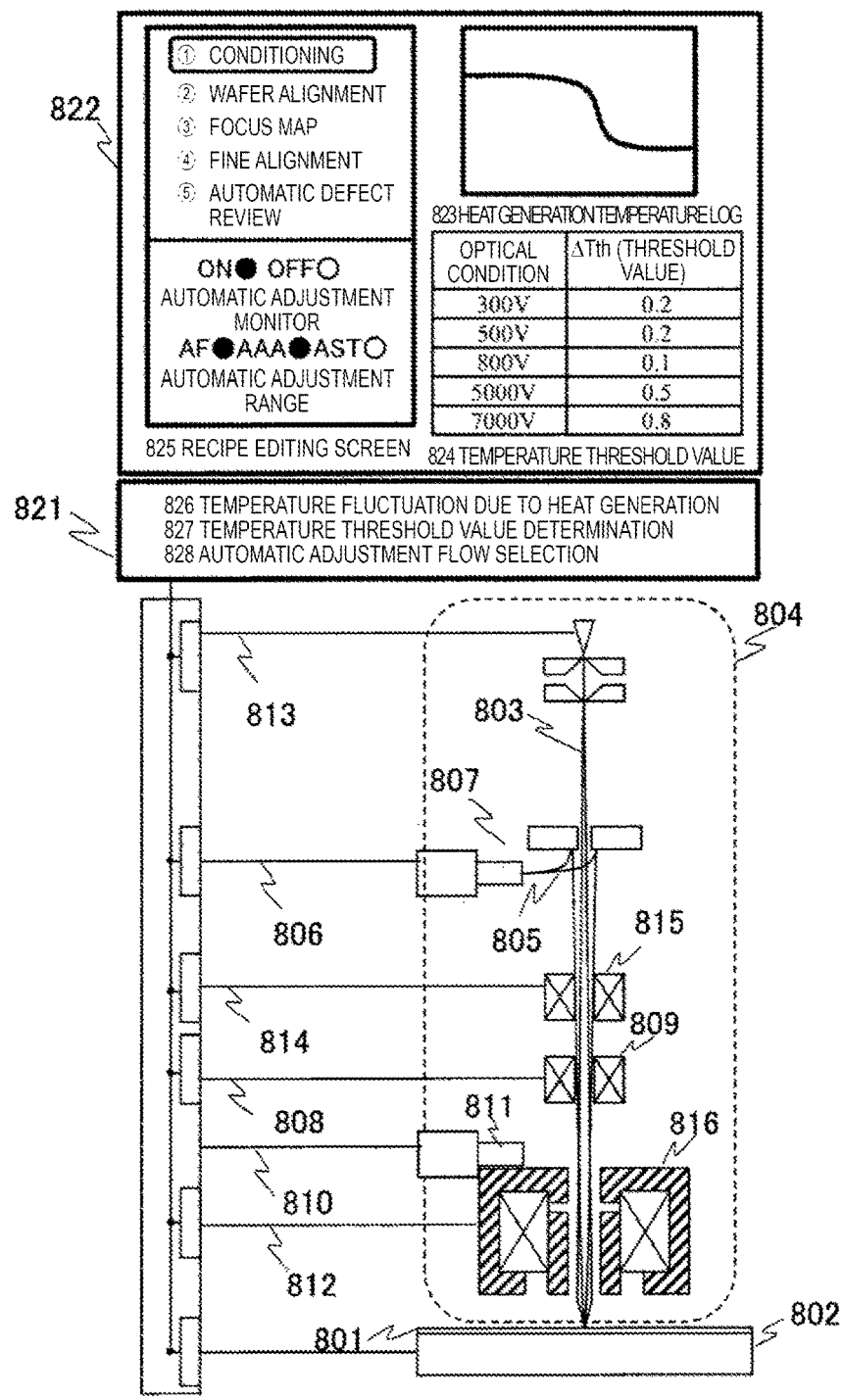

[Fig. 9]
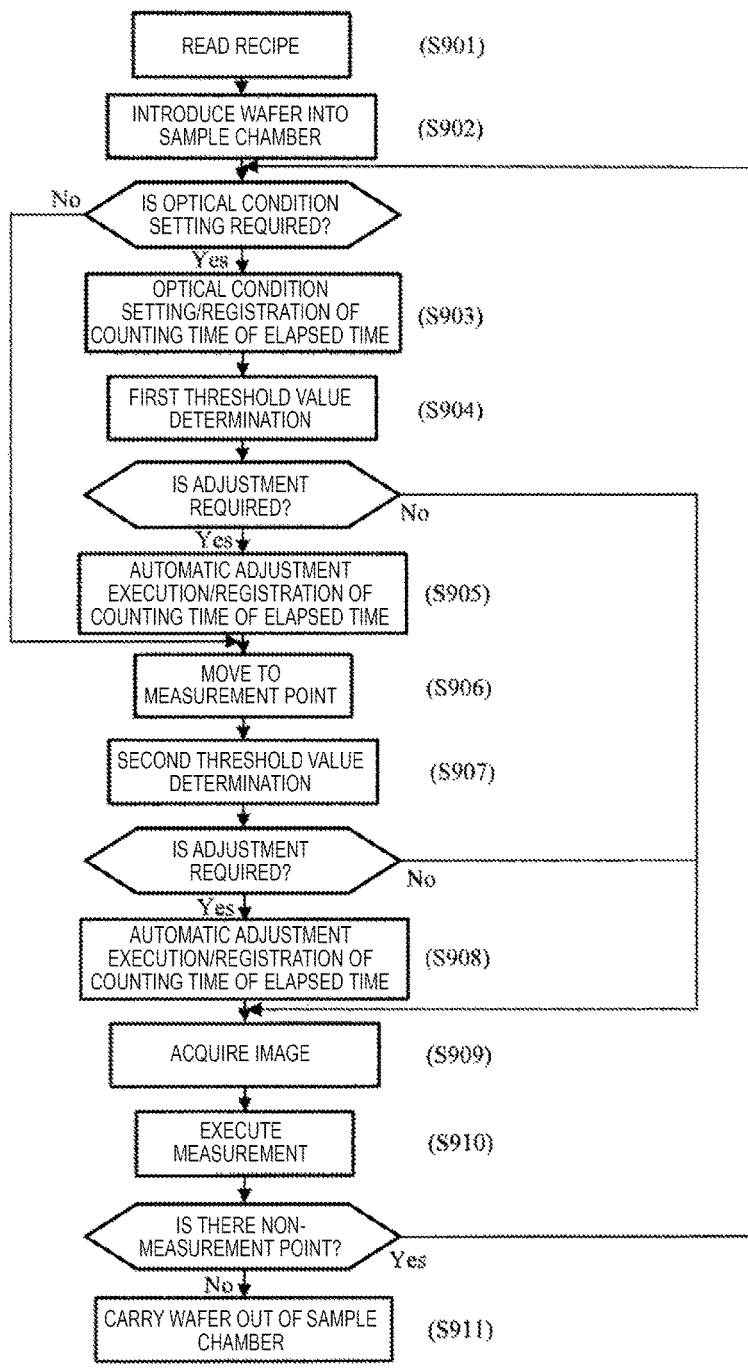

CHARGED PARTICLE BEAM APPARATUS

CROSS REFERENCE TO RELATED APPLICATIONS

This application is a continuation of U.S. application Ser. No. 15/292,832, filed Oct. 13, 2016, which claims priority under 35 U.S.C. § 119 from Japanese Patent Application No. 2015-203339, filed Oct. 15, 2015, the entire disclosures of which are herein expressly incorporated by reference.

TECHNICAL FIELD

The present invention relates to a charged particle beam device which observes, inspects, or measures a fine circuit pattern of a semiconductor device, a liquid crystal, or the like by a charged particle beam, and in particular, to a charged particle beam device provided with an adjustment element which adjusts the optical condition of a charged particle beam.

BACKGROUND ART

According to the miniaturization and complexity of a semiconductor device, a technique of managing a lithography or etching process by inspecting and measuring a fine pattern of about 10 nm formed on a wafer with a high degree of accuracy and at high speed is widely used in semiconductor plants in the world. In particular, a length measurement scanning electron microscope (Critical Dimension Scanning Electron Microscope: CD-SEM) is a measurement device essential to process management of a fine pattern.

In order to perform high-precision measurement by using a device such as the CD-SEM, a device condition needs to be properly set. In PTL 1, there is described a technique of determining the necessity of automatic focus adjustment (Auto Focus: AF) on the basis of the evaluation of a power spectrum high-frequency component of a SEM image. In PTL 2, there is disclosed a method of determining the necessity of axis adjustment of a charged particle beam on the basis of an image quality evaluation value of a SEM image. In PTL 3, there is disclosed a method of determining the necessity of an aberration correction on the basis of the output result of an environment sensor, or the detection results of the sharpness of images captured from a plurality of directions, in a SEM equipped with an aberration corrector. In PTL 4, there is disclosed an electromagnetic lens in which it is provided with two coils and it is possible to adjust a focusing condition while making the amount of heat generation constant, by adjusting the difference between currents flowing through both the coils, while making the sum of the currents constant.

CITATION LIST

Patent Literature

PTL 1: JP-A-10-333020
PTL 2: JP-A-2010-182424 (corresponding U.S. Pat. No. 8,294,118)
PTL 3: JP-A-2014-135227
PTL 4: JP-A-2009-176542

SUMMARY OF INVENTION

Technical Problem

In the CD-SEM which is installed in a mass-production plant for a semiconductor device, very high processing capacity is required, and in particular, the shortening of the time of movement/image capture/measurement (Move Acquire Measure: MAM time) during automatic measurement and improvement of wafer processing capacity per unit time are required. In recent years, in addition to line-width measurement of a standard line and space (L & S) pattern, measurement of the bottom widths and side wall shapes of a deep groove and a deep hole has been frequently used.

If the setting conditions of an electron beam are changed during automatic measurement in order to measure these various measurement targets, the equilibrium state of an optical element such as an objective lens collapses from immediately after the switching, whereby the focus of the electron beam is shifted, and further, there is a case where astigmatism or axis shift occurs. It is not possible to evaluate the discrepancy between a temperature at which the objective lens enters an equilibrium state and the current temperature, and therefore, in order to perform measurement at proper beam conditions, it is considered to interrupt the measurement for a sufficient period of time in which a device is stabilized, or to frequently perform automatic adjustment of the beam. However, the measurement interruption or the frequent automatic adjustment reduces the MAM time.

In particular, in a case of performing a determination of the necessity of adjustment by using the image processing technique and the like as described in PTLs 1 to 3, it is necessary to perform image acquisition for the adjustment, or it is necessary to provide a sensor or the like for determining the necessity of the adjustment. Further, it is difficult to evaluate deviation from the equilibrium state of the objective lens by seeing an image or the like, and therefore, it is not possible to determine a proper adjustment timing which changes according to the deviation from the equilibrium state of the objective lens. It is also conceivable to adjust the amount of current flowing through two coils in order to adjust a focusing condition, while making the amount of heat generation constant, as described in PTL 4. However, in terms of two coils being put in the electromagnetic lens and the two coils being controlled at the same time, application to the device is difficult from the aspects of a space and cost.

A charged particle beam device having an object to perform proper beam adjustment while suppressing a decrease in MAM time, with a simple configuration without adding a lens, a sensor, or the like, is proposed below.

Solution to Problem

As an aspect for achieving the above object, there is proposed a charged particle beam device including: an optical element which adjusts a charged particle beam emitted from a charged particle source; an adjustment element which adjusts an incidence condition of the charged particle beam with respect to the optical element; and a control device which controls the adjustment element, in which the control device determines a difference between a first feature amount indicating a state of the optical element based on the condition setting of the optical element, and a second feature amount indicating a state where the optical element reaches based on the condition setting and executes adjustment by the adjustment element when the difference is greater than or equal to a predetermined value.

Advantageous Effects of Invention

According to the above configuration, both of higher throughput of the device and high-precision measurement or inspection based on beam adjustment at a proper timing can be realized.

BRIEF DESCRIPTION OF DRAWINGS

FIG. 1 is a schematic diagram showing a basic configuration of a charged particle beam device.

FIG. 2 is a flowchart showing a temperature fluctuation tracking processing step.

FIG. 3 is a flowchart for describing a threshold value determination processing step during automatic measurement.

FIG. 4 is a list of temperature threshold values with respect to the acceleration, the current, and the depth of focus of an electron beam.

FIGS. 5A-5E are diagrams showing setting examples of a threshold value determination during the automatic measurement in a measurement recipe editing screen.

FIG. 7 is an optical condition switching sequence during the automatic measurement.

FIG. 8 is a schematic diagram showing a basic configuration of a charged particle beam device according to a second example.

FIG. 9 is a flowchart showing a measurement step of a measurement device stored in a recipe.

DESCRIPTION OF EMBODIMENTS

Figure 6A:
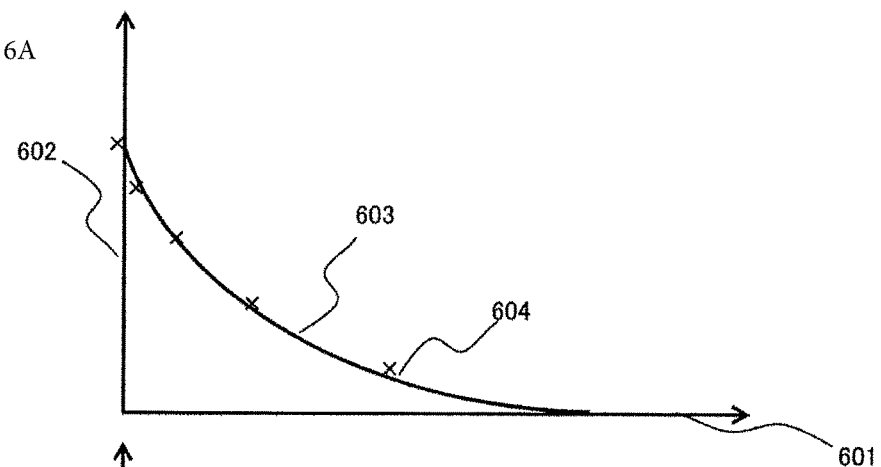
FIGS. 6A-6C are diagrams showing displacement of the feature amount of an optical element.

A temperature fluctuation amount, a magnetic field fluctuation amount, a pressure change amount, and the like occurring in a change in setting of a beam are the feature amounts of an optical element, which act on an operating status of the optical element through a material property. There is a case where it is possible to calculate the feature amount of the optical element from the history of device setting of control values of a current, voltage, and the like which control the optical element. For example, a temperature fluctuation amount from an equilibrium state in the setting condition of an electron beam can be calculated based on the history of device setting of the amount of heat generation of an objective lens.

Hereinafter, a charged particle beam device having a function of carrying out arbitrary automatic adjustment in a case where the temperature fluctuation amount exceeds an arbitrary threshold value will be described. By being provided with a monitor device for monitoring a temperature fluctuation amount, it becomes possible to perform automatic adjustment only in a switching condition in which a length measurement value fluctuation occurs, and thus it is possible to avoid unnecessary automatic adjustment. Accordingly, it is possible to provide a charged particle beam device which realizes automatic measurement in which both of a throughput and high-precision measurement can be achieved.

According to examples which are described below, it is possible to provide a signal detection method, and a device which instantly changes the acceleration, the current, and the depth of focus of an electron beam, by avoiding unnecessary automatic adjustment, and the diversification of a measurement target, improvement in usability of a user, and high-precision measurement can be realized together.

Example 1

FIG. 1 is a diagram showing an outline of a charged particle beam device and is for illustrating the configuration of a CD-SEM.

A column 1 of the CD-SEM is provided with an electron gun 2, and a wafer 11 disposed on a stage 12 is irradiated with an electron beam 4 emitted from the electron gun 2. The inside of the column 1 is evacuated in a vacuum state, and the electron beam 4 passes through a vacuum space. The electron beam 4 performs one-dimensional or two-dimensional scanning due to a deflector 5, and electrons which are emitted from the wafer 11 on the basis of the scanning, or secondary electrons 13 which are generated due to the electrons colliding with another member are detected by a detector 13. A detection signal 15 is stored in a memory or the like built into a control PC 21 or the like in synchronization with a scanning signal 8 of the deflector 7 and becomes a waveform signal or an image signal.

The control PC 21 (a control device) is provided with a memory in which an operation program for operating the CD-SEM, which is referred to as a recipe, is stored, and an optical element or a stage built into the CD-SEM is operated according to the recipe. An acceleration voltage condition of the electron beam according to a measurement target, or a focusing condition (an exciting current) of an objective lens 9 when has been set to the acceleration voltage is written in the recipe, and the optical conditions of the optical element (the objective lens or the like) according to measurement coordinates or the type of a sample are automatically set. Further, information about an optical axis adjustment timing using an aligner 7 or the like is also written in the recipe, and it is possible to perform optical axis adjustment (beam alignment) as often as necessary. Further, the optical axis adjustment is performed by deflecting the beam such that the electron beam 4 passes through the ideal optical axis. For example, in a case of performing the optical axis adjustment with the objective lens 9 set as the optical element, the deflection condition (an adjustment condition by an adjustment element) of the aligner 7 is adjusted such that the movement (parallax) of an image occurring when the excitation condition of the objective lens is changed becomes zero or becomes close to zero.

The column 1 and the control PC 21 are connected through a bus line 20, and the bus line 20 transmits signals such as a control voltage 2 which determines the acceleration voltage of the electron gun 2, the detection signal 15 which is obtained by the detector 14, an aligner signal 6 of the aligner 5, the deflection signal 8 of the deflector 7, and a lens current 10 of the objective lens 9, from the control PC 21 to the column 1 and from the control PC 21 to the column 1.

Further, the control PC 21 monitors the lens current 10 in a process in which control of moving the stage 12 is performed such that a measurement point on the wafer 11 is positioned at an irradiation point of the electron beam 4. A temperature fluctuation 26 due to heat generation of the objective lens 9 is found out based on this monitoring. Further, a temperature threshold value determination 27 is performed by using a temperature threshold value 24 which charges according to a change of the control voltage 3 (acceleration voltage), and automatic adjustment selection 28 is performed in accordance with the situation of the device, and automatic adjustment is carried out by controlling the optical element by the aligner signal 6, the lens current, or the like.

The temperature threshold value determination 27 is operated according to the setting of an automatic adjustment monitor of a recipe editing screen 25 which is displayed on a GUI 22, and performs a threshold value determination which depends on a measurement target pattern. The automatic adjustment selection 28 is operated according to the parameter setting of an automatic adjustment range of the measurement recipe editing screen 25 which is displayed on the GUI 22. A heat generation temperature log 23 is displayed at the time of the maintenance of the temperature threshold value 24 or the tuning work of the recipe editing screen 25. As a result, it becomes possible to perform the automatic adjustment only in a switching condition in which length measurement value fluctuation occurs, without a stabilization wait at the time of the switching between the optical conditions, and thus the CD-SEM can be realized which enables automatic measurement in which both of high rate of automation due to automatic adjustment at a proper timing and high throughput due to the avoidance of unnecessary automatic adjustment can be achieved.

A specific operation principle will be described below. If a constant current is made to flow through a coil of the objective lens over a sufficient period of time, the thermal conduction of a constituent material, the thermal conduction of the air, and the amount of heat generation are balanced, and thus a temperature enters an equilibrium state. An equilibrium state due to the heat generation of the objective lens by an expression of thermal conduction at this time is expressed by the following expression.

$$\Delta T = T - T_B = K \times \Omega \times I^2 = K \times W$$

T is a temperature, $T_B$ is the temperature of the environment in which the objective lens is installed, K is an effective thermal resistivity, W is the amount of heat generation, $\Omega$ is the resistance of the objective lens coil, and I is an objective lens current. On the other hand, the deviation from the equilibrium temperature when the amount of heat generation is changed is expressed by the following expressions.

$$\delta T = \sum_i \frac{\partial T}{\partial t} dt \bigg|_i - K \times W =$$

$$\sum_i \frac{1}{\tau} \times (K \times W_i - \Delta T_{i-1}) \times e^{-(t_i - t_{i-1})/\tau} - K \times W$$

$$\Delta T_{i-1} = \sum_{j=1}^{i-1} \frac{1}{\tau} \times (K \times W_j - \Delta T_{j-1}) \times e^{-(t_j - t_{j-1})/\tau}$$

Here, $\delta T$ is the deviation from the equilibrium temperature of the objective lens, K is the effective thermal resistivity, $\tau$ is a relaxation time, W is the amount of heat generation, and t is a time. From these expressions, if the objective lens starts the monitoring of the amount of heat generation from the state of the equilibrium temperature, thereby tracking setting history, the expression, $T_o = K \times \Omega \times I_2$, is established, and thus it is possible to track $\Delta T$. Even in a case where $\Delta T_o$ is not accurate, if the amount of heat generation is monitored for a sufficiently longer period of time than the relaxation time, the influence on the calculation of $\Delta T$ can be suppressed. In a case where a time interval to monitor the amount of heat generation is sufficiently shorter than the relaxation time $\tau$, the deviation from the equilibrium temperature is expressed by the following expressions.

$$\Delta T_i = \frac{1}{\tau} \times (K \times W_i - \Delta T_{i-1}) \times (t_i - t_{i-1}) \div \tau + \Delta T_{i-1}$$

$$\delta T = \Delta T_i - K \times W_i$$

If a flow of obtaining $\Delta Ti$ from $\Delta T_{i-1}$ and $t_{i-1}$ stored in a memory by monitoring Wi and ti and calculating them before one time is repeated, it is possible to accurately determine $\delta T$.

FIG. 2 is a flowchart of temperature fluctuation tracking by specific objective lens setting. A determination of necessity of objective lens temperature monitoring 202 is performed with a time interval, the amount of current change of the objective lens, or the like as a criterion for determination, and in a case where the monitoring is required, $\delta T$ and $\Delta Ti$ are determined in calculation of deviation from the equilibrium temperature 203 and held in the device, a temperature fluctuation tracking continuation determination 204 is performed, and the routine returns back to START 201. Next, in a case where the calculation of deviation from the equilibrium temperature 203 is performed, $\delta T$ and $\Delta T_{i+1}$ are determined and held in the device.

In a case where the automatic adjustment is carried out due to $\delta T$ exceeding a threshold value after the setting condition of the electron beam is changed, $\delta T$ often exceeds the threshold value at the time of the next necessity determination. However, in the setting condition of the electron beam automatically adjusted in a non-equilibrium state, unlike the setting condition in the equilibrium state of the objective lens, a wrong threshold value determination in which automatic adjustment is not essential in the necessity determination is often performed. As a result, after the setting condition of the electron beam is changed, automatic adjustment is inappropriately carried out in succession. In order to avoid this problem, the elapsed time from the previous automatic adjustment and the temperature fluctuation amount must be changed to the criteria for the determination of necessity of the automatic adjustment.

FIG. 3 is a flowchart of a threshold value determination during the automatic measurement. START 301 is performed in a state where the temperature fluctuation tracking of FIG. 2 is started in advance and thus $\delta T$ can be immediately referred, the recipe is read by loading a wafer and the setting of the electron beam is made. A threshold value determination 302 is performed due to the deviation from the equilibrium temperature of the objective lens. Automatic adjustment 303 is performed, and $\delta T$ at that time and an implementation time are held in the device. Measurement after movement to a measurement point 304 is performed.

In a case where the measurement is continued in 305, the routine returns back to START 301, and in a case where the setting of the electron beam is changed, the threshold value determination 302 is performed due to the deviation from the equilibrium temperature of the objective lens, and in a case where the setting of the electron beam is not changed, the threshold value determination 302 is performed with respect to each difference between $\delta T$ and the implementation time recorded in the previous automatic adjustment 303. The threshold value determination 302 complies with the temperature threshold value with respect to the electron beam setting, and the recipe setting. The number of measurement points when performing the measurement after movement to a measurement point 304 complies with the recipe setting.

In general, the setting condition of the electron beam is adjusted by the optical element in the equilibrium state, and therefore, if the feature amount of the optical element deviates from the reference value, the focus, the astigmatism, and the axis of the electron beam are shifted. The amount of shift of the focus, the astigmatism, and the axis of the electron beam depends on the acceleration, the current, and the depth of focus of the electron beam, and therefore, a list of the threshold values of the feature amount of the optical element needs to be held in the device. FIG. 4 is an example of a list of temperature threshold values with respect to the acceleration, the current, and the depth of focus of the electron beam. The combination of the acceleration, the current, and the depth of focus depends on the type of the device, and there is a case where the combination varies between the devices. The threshold value is an allowable value of the deviation from the equilibrium temperature of the objective lens. There is also a case where the threshold value is specified in the range of the reference value. In a case where there are a plurality of feature amounts of the optical element which is monitored, if a list of the threshold values is provided for each of the feature amounts and can be displayed on the GUI, the list is used at the time of maintenance of the device or recipe tuning.

In a semiconductor device mass-production plant, 50 to 2000 pieces of length measurement recipes per day are input to a single device. A case where the threshold value of the feature amount of the optical element also depends on a measurement target pattern is also included in the length measurement recipe. This is because there is a case where allowable errors of the focus, the astigmatism, and the axis of the electron beam depend on the measurement target pattern. At this time, unlike the threshold value of the feature amount of the optical element which depends on the acceleration, the current, and the depth of focus of the electron beam, the setting of the threshold value determination is required for each length measurement recipe which becomes a target.

In FIGS. 5A-5E, five examples of the length measurement recipe editing screen in which the setting of the threshold value determination during the automatic measurement can be made are taken. FIG. 5A is an example of the length measurement recipe editing screen which includes only an ON/OFF button of the threshold value determination during the automatic measurement. FIG. 5B is an example of the editing screen made so as to be able to set the range of the automatic adjustment for each length measurement sequence. FIG. 5C is an example of the editing screen in a case where the automatic adjustment is forcibly carried out. FIG. 5D is an example in which change setting of the threshold value determination is added to the length measurement recipe editing screen in accordance with the measurement target pattern. FIG. 5E is an example of a threshold value list editing screen for changing the threshold value determination according to the setting history of the electron beam.

Figure 6B:
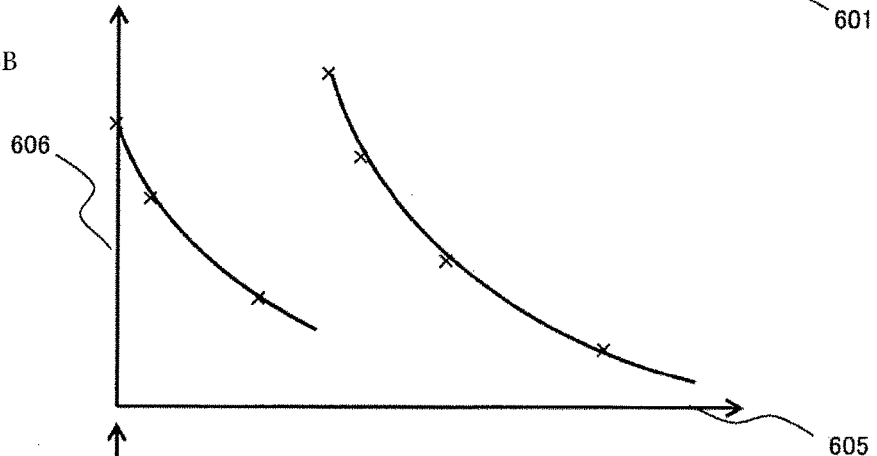
Figure 6C:
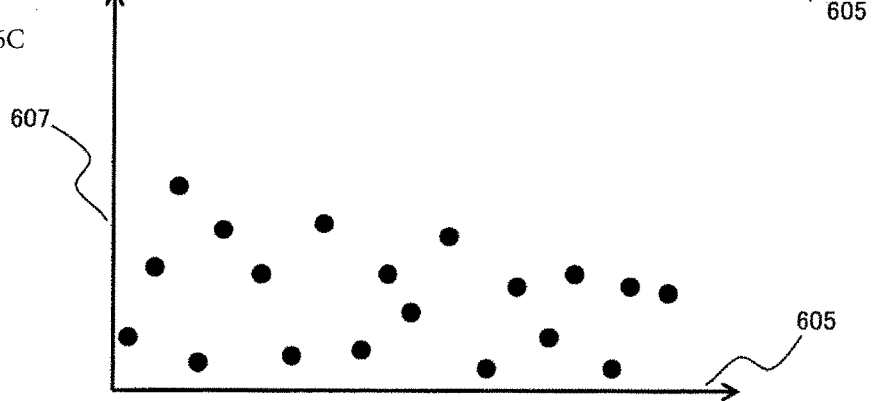

There is a case where the tuning of the determination of the threshold value of the length measurement recipe, the maintenance of the list of the threshold values of the feature amount of the optical element, or the like is required. However, the combination of the switching conditions is a factorial of the setting condition of the electron beam that the device holds, and the tuning or the maintenance in an actual machine is difficult. Therefore, the work procedure of the device during efficient operation, such as a method of confirming the accuracy of the threshold value determination and a tuning and maintenance method, is described in a manual. In order to proceed with the work in accordance with the manual, a log screen of the deviation from the equilibrium state of the feature amount of the optical element of FIGS. 6A-6C is displayed and the explanation of the log screen is also described in the manual. FIGS. 6A-6C show examples of the log screen of the deviation from the equilibrium state of the feature amount of the optical element. Shown is an example in which automatic adjustment markers 604 are plotted in a log screen of a time axis 601 and a δT axis 602 of the deviation from the equilibrium temperature of the objective lens. Shown are examples in which logs are shown in the coordinates of a δT axis 606 and a length measurement reproducibility 3σ axis 607 with respect to a time axis 605. Instead of the 3σ axis 607, an axis of a length measurement value, resolution, a focus value, or the like may be adopted.

Due to the miniaturization and complexity of the measurement target pattern, it is necessary to perform measurement with the setting of the electron beam changed for each sample type. Especially, in recent years, in addition to an electron beam in a relatively low energy range such as a range of 500 V to 1600 V, an electron beam in a range of 2000 V to 5000 V has also been used. However, if the acceleration energy of an electron beam is greatly changed, the focus of the electron beam is shifted for a long period of time, and astigmatism or axis shift also occurs. There is a possibility that the focus shift and the like may become a factor of the length measurement value fluctuation. In a case where the optical condition is switched at a level in which the length measurement value fluctuation occurs, it is possible to suppress the length measurement value fluctuation by providing a waiting time until the device is stabilized. However, in a mass-production plant for a semiconductor device or the like, in which higher throughput is required, it is believed that improvement of the operating time of the device is required.

On the other hand, if an automatic adjustment function such as focus adjustment, astigmatism correction, and axis adjustment of the electron beam is used, it is possible to suppress the length measurement fluctuation without a waiting time. However, a corresponding time is required even for the adjustment, and therefore, it is believed that an automatic measurement algorithm in which these adjustments are not performed as much as possible while satisfying a proper optical condition is required.

The length measurement value varies according to environment such as an air temperature or air pressure, or a change in the setting of the optical element in the column. In particular, the length measurement value varies according to fluctuation of the amount of heat generation at the time of the switching between the optical conditions of the objective lens. FIG. 7 is a diagram showing an example of a sequence of switching between the optical conditions during the automatic measurement. A function of monitoring the fluctuation history of the amount of heat generation of the objective lens, a list of the threshold values of the fluctuation history for each optical condition, a function of carrying out the automatic adjustment in a case of exceeding the threshold value, and an exclusive processing function of continuous triggering occurring in a case of exceeding the threshold value, and the automatic adjustment with respect to the length measurement sequence are installed in the CD-SEM, whereby even in a case where the optical condition is greatly changed due to the switching between samples, it becomes possible to perform high-precision measurement without a waiting time.

FIG. 9 is a flowchart showing a measurement processing step when executing the measurement of a semiconductor wafer on the basis of an operation program stored in the recipe, and shows in particular a step of performing the calculation of the deviation from the equilibrium temperature of the objective lens, and the calculation of the elapsed time from the previous automatic adjustment time and the difference between an objective lens temperature at the time of the previous automatic adjustment and the current objective lens temperature, in parallel with the measurement processing. First, the control PC 21 reads the recipe selected or generated according to a measurement target sample and sets it to the device as an operation program (Step 901). Next, the wafer 11 is introduced into a sample chamber (not shown) and placed on the stage 12 (Step 902). Before a sample is placed on the stage, processing for placing the wafer at a proper position on the stage, such as pre-alignment, is executed.

Next, whether or not it is necessary to greatly change the optical condition (for example, the excitation condition of the objective lens) is determined with reference to the recipe, and in a case where the change is required, the setting of the optical condition is performed and a setting time (a counting time) thereof is recorded (Step 903). The counting time is used in order to calculate the above-described $\delta T$ or the like. Further, in a case where it is not necessary to change the optical condition, the movement of the stage is performed such that the measurement point and the irradiation position of the beam coincide with each other (Step 906). A case where it is necessary to greatly change the optical condition is, for example, a case of changing the acceleration energy of the electron beam from 500 eV to 5000 eV, and a case of greatly changing the focusing condition of the objective lens according to a large change of the acceleration energy corresponds thereto.

When the optical condition is changed at Step 903, a determination of whether or not the automatic adjustment such as axis adjustment is executed is performed (Step 904). First, the necessity of the automatic adjustment is determined based on a first criterion for determination (Th1). Specifically, in a case where the elapsed time $\Delta Tp$ from the previous automatic adjustment time is greater than or equal to a predetermined value (Th11≤$\Delta Tp$), the automatic adjustment is executed. The reason to perform such a determination is because it is believed that after a considerable time has elapsed from the previous automatic adjustment, the optical axis is greatly shifted. Further, in a case where a variation between a lens temperature ta at the time of the previous automatic adjustment and the current lens temperature tn is greater than or equal to a predetermined value (Th12≤(ta−tn)), the automatic adjustment is executed (Step 905). In Step 905, a counting time for calculating the above $\Delta Tp$ is registered.

In a case where a change in the temperature of the lens is greater than or equal to a predetermined value, it is considered that the objective lens condition greatly varies in order to approach the equilibrium state, and there is a case where the condition of the optical axis or the like changes accordingly, and therefore, the necessity of the automatic adjustment is determined based on such a criterion for determination. Further, in a case where the above-described $\delta T$ is greater than or equal to a predetermined value (Th13≤$\delta T$), a determination is made to perform the automatic adjustment. A state where $\delta T$ is large is a state where fluctuation over time of the lens condition is large, and therefore, the state is determined as a timing for performing the automatic adjustment. In Step 903, a threshold value determination is performed with respect to each of three parameters, and when at least one of the three parameters satisfies the above predetermined condition, the automatic adjustment is executed. $\delta T$ is an index value indicating the deviation of the temperature which is one feature amount indicating the state of the objective lens. That is, it indicates the difference between the current temperature (a first feature amount) and a reaching temperature (a second feature amount) when has entered the equilibrium state, and the objective lens is changed from a first state to a second state by obtaining such an index value and performing the threshold value determination, and in a case of immediately retuning back to the first state, it becomes possible to continue measurement without performing unnecessary automatic adjustment.

As described above, by performing the determination of the necessity of the automatic adjustment by using the extent of the discrepancy between the automatic adjustment time and the current time, or objective lens temperature information (the extent of the deviation from the equilibrium temperature, information about the difference between the temperature of the objective lens at the time of the previous adjustment and the current objective lens temperature, or the like) which is obtained from the optical condition (an excitation current) of the optical element such as the objective lens and the elapsed time, it becomes possible to perform the adjustment at a proper timing.

After the automatic adjustment is performed in Step 905, stage movement is performed such that the irradiation position of the electron beam is positioned at the measurement target pattern (Step 906). Further, in the flowchart illustrated in FIG. 9, an example in which the automatic adjustment is performed before measurement point movement is described. However, image acquisition in a case of performing the automatic adjustment may be performed at the measurement point. Next, in Step 907, a second threshold value (Th2) determination is performed (Step 907). Here, in a case where the elapsed time from the previous automatic adjustment time is greater than or equal to a predetermined value (Th21≤Tp), or a case where the discrepancy between the lens temperature at the time of the previous automatic adjustment and the current lens temperature is greater than or equal to a predetermined value (Th22≤ta−tn), or in a case where any condition is satisfied, a determination of the automatic adjustment (Step 908) is performed.

At a timing just after the optical condition is changed and the automatic adjustment based on the first threshold value determination is performed, the threshold value determination condition using Th21 and Th22 is not satisfied. However, if measurement is continued for a while without changing the optical condition, there is a possibility that axis shift or the like which occurs according to a temporal change or the transition to the equilibrium state of the objective lens may be actualized, and therefore, by performing the determination of the necessity of the automatic adjustment as in Step 907, it becomes possible to perform the automatic adjustment at a proper timing.

By passing through the steps as described above, it is possible to know a proper timing of the automatic adjustment without acquiring an image, and thus it becomes possible to execute image acquisition and the measurement based on the acquired image, under the proper optical condition (Steps 909 and 910). After the measurement of a certain measurement point is executed, in a case where there is a measuring point which is not measured, the necessity of the automatic adjustment is determined again and the measurement is then continued. If the measurement of all the measurement points of the wafer introduced into the sample chamber is ended, the wafer is carried out of the sample chamber and the measurement of the wafer is ended (Step 911).

In this example, apart from the image acquisition of the SEM, the temperature state of the optical element such as the objective lens is continuously monitored, and therefore, it is possible to perform the automatic adjustment at a proper timing without performing a wrong determination or the like using an image acquired in a state where the optical condition is shifted.

Example 2

In Example 2, an application example to a review device and an inspection device will be described. A technique of forming a fine pattern of a semiconductor device, a liquid crystal device, a hard disk, or the like is composed of processes of a very large number of steps, in which the number of processes is up to several hundreds. If defects occur in a fine patter or a formed film due to the failure of a process, there is a case where manufacturing defects of a device are generated in a large numbers, and thus, for maintenance and improvement of device production yield, it is necessary to continuously specify a cause of a defect and carry out a countermeasure. For this reason, defects of the device are monitored by inspecting foreign matter, disconnection of a wire, or the like for each major process. In general, in an inspection device, an optical application device for foreign material inspection, appearance inspection, or the like is used. However, there is a throughput restriction. For this reason, defects are monitored by monitoring the number or density of defects by using the narrowing of a process range with respect to an inspection target, or snap inspection. Further, there is a case of performing the analysis and classification of the defect by using a review device of the defect coordinates detected by the inspection device. Especially in a review device using a scanning electron microscope, the analysis of a high-magnification observation image and an element of the defect is performed.

FIG. 8 is a schematic diagram showing an overall configuration diagram of a charged particle beam device according to the second example, that is, a review device. The review device is configured of a stage 802 for holding a wafer 801, a column 804 for converging an electron beam 803 onto the wafer, a secondary electron detector 807 for converting secondary electrons 805 which are emitted from the wafer 801 into a detection signal 806, an image generation system for converting the detection signal into a digital image, an image processing system for analyzing the coordinates and the shape feature amount of an observation target from the digital image, a deflection signal 808 for irradiating the coordinates of the observation target with the electron beam, and a deflector 809 for deflecting the electron beam according to the deflection signal. If an X-ray detector 811 for converting the X-rays which are emitted from the wafer into a characteristic X-ray signal 810 is added, a defect can be analyzed in more detail. The automatic adjustment is carried out by holding temperature fluctuation due to heat generation 826 by monitoring an objective lens current 812 during automatic defect review, performing a temperature threshold value determination 827 by using a temperature threshold value 824 for the setting of the electron beam which is changed by control voltage 813 or the like, and controlling an optical element such as an aligner 815 or an objective lens 816 by an aligner signal 814, a lens current, or the like by performing automatic adjustment selection 828 in accordance with the situation of the device. The temperature threshold value determination 827 is operated according to the setting of an automatic adjustment monitor of a recipe editing screen 825 which is displayed on a GUI 822, and performs a threshold value determination that depends on a defect review target pattern. The automatic adjustment selection 828 is operated according to parameter setting of an automatic adjustment range of the inspection recipe editing screen which is displayed on the GUI. A heat generation temperature log 823 is displayed at the time of the maintenance of the temperature threshold value 824 or the tuning work of the inspection recipe editing screen. As a result, it becomes possible to carry out the automatic adjustment only in the switching condition in which length measurement value fluctuation occurs, without stabilization wait at the time of the switching between the optical conditions, and thus it is possible to realize the review device which enables automatic defect review in which both of a high rate of automation by the automatic adjustment at a proper timing and high throughput by avoidance of unnecessary automatic adjustment can be achieved.

A sequence at the time of the switching between the optical conditions during the automatic inspection will be described using FIG. 7 again. First, a semiconductor wafer is loaded. Next, inspection data detected by a foreign matter inspection device and an appearance inspection device is read into a central control device. Next, a target defect is extracted from the inspection data. Next, the column is set so as to be able to be observed in any beam acceleration. Next, wafer alignment is performed for coordinate correction by using a scanning observation image or the like of the electron beam. Next, movement to a defect position is performed by the combination of stage control and deflection of the electron beam. Next, scanning by the electron beam is performed, and an electric signal which is output from the secondary electron detector is converted by the image generation system, thereby forming a digital image. Next, the image processing system extracts the coordinates and the shape feature amount of the target defect from the digital image. When forming the digital image, there is also a method in which the coordinates of the target defect is detected at low-magnification imaging in advance and a zoom image of the target defect is acquired. The shape feature amount is a parameter which is used in order to perform appearance classification of the target defect. Next, the defect coordinates extracted from the digital image are irradiated with the electron beam by using a deflection system. Next, the composition classification of the target defect is performed by acquiring an X-ray energy spectrum which is emitted from the sample. By repeating the above flow, it is possible to automatically move to a plurality of target defects and efficiently collect a digital image, a shape feature amount, an element list, or the like for each target defect.

Due to the miniaturization and complexity of a defect review target pattern, it is necessary to change the setting of the electron beam for each sample type. Due to fluctuation of the focus, the astigmatism, and the axis of the electron beam, degradation of the image quality of the digital image, or erroneous detection of the shape feature amount or the element list occurs during a period of two hours at the maximum from immediately after the setting change of the electron beam. In general, in the case of sample replacement according to the setting change of the electron beam in which the image quality degradation or the erroneous detection occurs, a waiting time is provided until the device is stabilized. However, in a mass-production plant, it is not possible to wait until the device is stabilized, and thus it is required to perform defect review without providing a waiting time for each sample type.

If a function of automatically adjusting the focus, the astigmatism, and the axis of the electron beam is used, the defect review can be continuously performed without a waiting time. However, there is a case where an adjustment time longer than the defect review time is required. That is, it is problematic that it is not possible to carry out the automatic adjustment function by extracting the condition in which the image quality deterioration or the erroneous detection occurs. The condition in which the image quality deterioration or the erroneous detection occurs depends on fluctuation of environment such as an air temperature and air pressure and the setting history of the column. However, the influence of the fluctuation history of the amount of heat generation at the time of the switching between the optical conditions of the objective lens is strong. Therefore, a function of monitoring the fluctuation history of the amount of heat generation of the objective lens, a list of the threshold value of the fluctuation history for each optical condition, a function of carrying out the automatic adjustment in a case of exceeding the threshold value, and exclusive processing of the automatic adjustment with respect to continuous triggering which occurs in a case of exceeding the threshold value, and a length measurement sequence are installed in the review device, whereby it becomes possible to continue the defect review without providing a waiting time for each sample type.

REFERENCE SIGNS LIST

1: column
2: electron gun
3: control voltage
4: electron beam
5: aligner
6: aligner signal
7: deflector
8: deflection signal
9: objective lens
10: objective lens current
11: wafer
12: stage
13: secondary electron
14: detector
15: detection signal
20: bus line
21: control PC
22: GUI
23: heat generation temperature log
24: temperature threshold value
25: recipe editing screen
26: temperature fluctuation due to heat generation
27: temperature threshold value determination
28: automatic adjustment selection
201: START
202: determination of necessity of objective lens temperature monitoring
203: calculation of deviation from equilibrium temperature
204: temperature fluctuation tracking continuation determination
205: END
301: START
302: threshold value determination
303: automatic adjustment
304: measurement after movement to measurement point
305: measurement continuation determination
306: END
601: time axis
602: δT axis
603: log curve of δT
604: automatic adjustment marker
605: time axis
606: δT axis
607: 3σ axis
801: wafer
802: stage
803: electron beam
804: column
805: secondary electron
806: detection signal
807: secondary electron detector
808: deflection signal
809: deflector
810: characteristic X-ray signal
811: X-ray detector
812: objective lens current
813: control voltage
814: aligner signal
815: aligner
816: objective lens
821: control PC
822: GUI
823: heat generation temperature log
824: temperature threshold value
825: recipe editing screen
826: temperature fluctuation due to heat generation
827: temperature threshold value determination
828: automatic adjustment flow selection

The invention claimed is:

1. A charged particle beam device comprising:
an optical element which adjusts a charged particle beam emitted from a charged particle source;
an adjustment element which adjusts an incidence condition of the charged particle beam with respect to the optical element; and
a control device which controls the adjustment element, wherein the control device continuously tracks or calculates a temperature fluctuation of the optical element based on a condition setting and the incidence condition of the charged particle beam with respect to the optical element.

2. The charged particle beam device according to claim 1, wherein the temperature fluctuation indicates a degree of deviation from an equilibrium temperature of the optical element.

3. The charged particle beam device according to claim 2, wherein the control device obtains a difference between a predetermined threshold stored in the control device and the degree of deviation and executes an adjustment by the adjustment element when the difference is equal to or larger than a predetermined value.

4. The charged particle beam device according to claim 3, wherein the control device stores a date and a time and the degree of deviation when the adjustment is executed.

5. The charged particle beam device according to claim 4, wherein the predetermined threshold is set for the condition setting, the incidence condition, a length measurement recipe and a measurement target pattern.

6. The charged particle beam device according to claim 5, further comprising an editing screen on which the predetermined threshold is set.

7. The charged particle beam device according to claim 6, wherein the incidence condition is an acceleration voltage, an incidence current, or a depth of focus.

8. The charged particle beam device according to claim 4, wherein the control device executes length measurement of a measurement point based on a length measurement recipe after executing the adjustment by the adjustment element.

9. The charged particle beam device according to claim 8, wherein the control device displays on a screen a result of the execution of the adjustment by the adjustment element with a time history of the temperature fluctuation.

10. The charged particle beam device according to claim 9, wherein the control device displays on the screen a length measurement value, a resolution, a focus value, and a wavelength reproducibility with the time history of the temperature fluctuation.

11. The charged particle beam device according to claim 1, wherein the control device calculates an equilibrium temperature of the optical element based on the condition setting and the incidence condition of the optical element.

* * * * *